(12) United States Patent
Guo

(10) Patent No.: US 10,290,655 B2
(45) Date of Patent: May 14, 2019

(54) LOW TEMPERATURE POLYSILICON ARRAY SUBSTRATE AND METHOD FOR MANUFACTURING THE SAME

(71) Applicant: Wuhan China Star Optoelectronics Technology Co., Ltd., Wuhan, Hubei (CN)

(72) Inventor: Yuan Guo, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 15/327,226

(22) PCT Filed: Dec. 29, 2016

(86) PCT No.: PCT/CN2016/112989
§ 371 (c)(1),
(2) Date: Jan. 18, 2017

(87) PCT Pub. No.: WO2018/119865
PCT Pub. Date: Jul. 5, 2018

(65) Prior Publication Data
US 2018/0211978 A1   Jul. 26, 2018

(30) Foreign Application Priority Data

Dec. 27, 2016 (CN) .......................... 2016 1 1224771

(51) Int. Cl.
| | | |
|---|---|---|
| *H01L 27/12* | (2006.01) | |
| *H01L 21/266* | (2006.01) | |
| *H01L 29/786* | (2006.01) | |
| *H01L 21/02* | (2006.01) | |
| *H01L 21/265* | (2006.01) | |
| *H01L 29/165* | (2006.01) | |
| *H01L 21/768* | (2006.01) | |
| *H01L 29/66* | (2006.01) | |

(52) U.S. Cl.
CPC .... *H01L 27/1222* (2013.01); *H01L 21/02532* (2013.01); *H01L 21/02598* (2013.01); *H01L 21/02667* (2013.01); *H01L 21/266* (2013.01); *H01L 21/26513* (2013.01); *H01L 21/76802* (2013.01); *H01L 27/1218* (2013.01); *H01L 27/1274* (2013.01); *H01L 27/1288* (2013.01); *H01L 29/165* (2013.01); *H01L 29/66757* (2013.01); *H01L 29/78618* (2013.01); *H01L 29/78633* (2013.01); *H01L 29/78675* (2013.01)

(58) Field of Classification Search
CPC ........................... H01L 27/04; H01L 27/1222
See application file for complete search history.

(56) References Cited

U.S. PATENT DOCUMENTS

| | | | | |
|---|---|---|---|---|
| 9,935,137 B2* | 4/2018 | He | ..................... | G02F 1/133514 |
| 10,062,616 B2* | 8/2018 | Cho | ................ | H01L 21/823814 |

* cited by examiner

*Primary Examiner* — Quoc D Hoang

(57) ABSTRACT

A low temperature polysilicon array substrate and a method for manufacturing the same are disclosed. The method includes forming a light shield layer, a buffer layer, and a polysilicon island on a glass substrate in sequence, performing channel doping on an NMOS area of the polysilicon island, performing P− light doping on two sides of a PMOS area of the polysilicon island, performing N+ heavy doping, forming a gate insulating layer and a gate layer, and performing N− light doping and P+ heavy doping.

6 Claims, 2 Drawing Sheets

LOW TEMPERATURE POLYSILICON ARRAY SUBSTRATE AND METHOD FOR MANUFACTURING THE SAME

CROSS-REFERENCE TO RELATED APPLICATIONS

This application claims the priority of Chinese patent application CN 201611224771.4, entitled "Low temperature polysilicon array substrate and method for manufacturing the same" and filed on Dec. 27, 2016, the entirety of which is incorporated herein by reference.

FIELD OF THE INVENTION

The present disclosure relates to the technical field of array substrate manufacturing, and in particular, to a low temperature polysilicon array substrate and a method for manufacturing the same.

BACKGROUND OF THE INVENTION

In recent years, LTPS (Low Temperature Poly-silicon) technology has been developed continuously. As to a liquid crystal panel produced through the LTPS technology, an aperture ratio of the panel can be improved, brightness thereof can be improved, and power consumption thereof can be reduced. Therefore, the LTPS technology can be used for producing a product with a light weight, low power consumption and a high resolution. Since a carrier mobility ratio is improved, under an action of a strong electric field, carriers will drift and accelerate continuously along an electric field direction. The carriers can obtain a large kinetic energy to become hot carriers. The hot carriers can enter into a surrounding oxide layer directly or enter thereinto through a tunnel effect, and thus a property of a device will be affected, which is called as a hot carrier effect.

The hot carrier effect will severely influence an off-state current of a TFT (Thin Film Transistor) component. With respect to the TFT component, carrier in an N-type TFT is electron, and carrier in a P-type TFT is hole. A mobility ratio of electron is about 50 times that of hole, and thus the N-type TFT has a more obvious hot carrier effect. At present, a normal practice of controlling the hot carrier effect is to ignore the hot carrier effect in a PMOS (P-type Metal Oxide Semiconductor) transistor component and merely reduce the hot carrier effect in an NMOS (N-type Metal Oxide Semiconductor) transistor component. An ion implantation method is mostly used, i.e., a symmetrical LDD (lightly doped drain) structures are arranged between heavy doping source area and drain area on two sides of a gate and polysilicon. According to this method, only the hot carrier effect of the NMOS component can be alleviated, while the hot carrier effect of the PMOS component cannot be alleviated.

SUMMARY OF THE INVENTION

In order to solve the above problem, the present disclosure provides a low temperature polysilicon array substrate and a method for manufacturing the same to alleviate a hot carrier effect of a PMOS transistor.

According to one aspect, the present disclosure provides a method for manufacturing a low temperature polysilicon array substrate. The method comprises steps of:

forming a light shield layer on a glass substrate;

forming a buffer layer on the light shield layer, depositing a monocrystalline silicon material on the buffer layer, and treating the monocrystalline silicon material to form a polysilicon island;

doping a channel of an NMOS area of the polysilicon island and performing P− light doping on two areas at two sides of a PMOS area of the polysilicon island simultaneously with a first mask so as to form an NMOS channel and a PMOS channel respectively;

performing N+ heavy doping on the substrate after the substrate is treated by the first mask so as to form a source area and a drain area on two sides of the NMOS channel respectively;

forming a gate insulating layer on the substrate after the substrate is treated by the N+ heavy doping, then forming a gate layer on the gate insulating layer and performing N− light doping on the gate layer so as to form N− light doping areas between the NMOS channel and the source area and the drain area on two sides thereof; and treating the N− light doping areas with a second mask, performing P+ heavy doping on the substrate, and forming a source area and a drain area on two sides of the PMOS channel respectively and P− light doping areas between the PMOS channel and the source area and the drain area on two sides thereof.

According to one embodiment of the present disclosure, the step of doping a channel of an NMOS area of the polysilicon island and performing P− light doping on two areas at two sides of a PMOS area of the polysilicon island simultaneously with a first mask so as to form an NMOS channel and a PMOS channel respectively specifically comprises a step of:

implanting boron ions into two areas at two sides of the NMOS area and the two areas at the two sides of the PMOS area of the polysilicon island simultaneously with the first mask to perform P− light doping, so as to realize NMOS channel doping of the NMOS area and P− light doping of the two areas at the two sides of the PMOS area, and to form the NMOS channel and the PMOS channel respectively, wherein the PMOS channel is covered by the first mask, while a whole NMOS area and the two areas at the two sides of the PMOS area are exposed.

According to one embodiment of the present disclosure, the step of forming a source area and a drain area on two sides of the PMOS channel respectively and P− light doping areas between the PMOS channel and the source area and the drain area on two sides thereof specifically comprises a step of:

performing P+ heavy doping on a part of the PMOS area except PMOS channel with the second mask, wherein a width of an area on the second mask for covering the PMOS channel is larger than a width of an area on the first mask for covering the PMOS channel such that the source area and the drain area are formed in one part of the PMOS area which is treated by both P+ heavy doping and P− light doping and P− light doping areas are formed in another part of the PMOS area which is merely treated by P− light doping.

According to one embodiment of the present disclosure, the step of forming a light shield layer on a glass substrate specifically comprises depositing a metal material layer on the glass substrate and treating the metal material layer to form the light shield layer.

According to one embodiment of the present disclosure, the step of forming a buffer layer on the light shield layer, depositing a monocrystalline silicon material on the buffer layer, and treating the monocrystalline silicon material to form a polysilicon island specifically comprises sub steps of:

depositing a buffer material layer on the light shield layer to form the buffer layer;

depositing a monocrystalline silicon material layer on the buffer layer to form a monocrystalline silicon layer; and performing a crystallization treatment on the monocrystalline silicon layer to form the polysilicon island.

According to one embodiment of the present disclosure, the step of performing N+ heavy doping on the substrate after the substrate is treated by the first mask so as to form a source area and a drain area on two sides of the NMOS channel respectively specifically comprises a step of:

performing N+ heavy doping on a part of the NMOS area except the NMOS channel with the third mask so as to form the source area and the drain area on the two sides of the NMOS channel respectively.

According to one embodiment of the present disclosure, the step of forming a gate insulating layer on the substrate after the substrate is treated by the N+ heavy doping, then forming a gate layer on the gate insulating layer and performing N− light doping on the gate layer so as to form N− light doping areas between the NMOS channel and the source area and the drain area on two sides thereof specifically comprises sub steps of:

depositing an insulating material layer on the substrate after the substrate is treated by the N+ heavy doping to form the gate insulating layer;

depositing a metal material layer on the gate insulating layer and treating the metal material layer to form the gate layer; and performing N− light doping on the NMOS channel with a fourth mask to form the N− light doping areas between the NMOS channel and the source area and the drain area on two sides thereof.

According to one embodiment of the present disclosure, after the P− light doping areas are formed at the two sides of the PMOS channel, the method further comprises steps of:

forming a medium layer on the gate layer and an exposed gate insulating layer, and forming four first via holes in communication with the source area and the drain area of the NMOS channel and the source area and the drain area of the PMOS channel respectively through etching;

forming a source and a drain of a PMOS transistor and a source and a drain of an NMOS transistor on the medium layer, wherein the source and the drain of the PMOS transistor and the source and the drain of the NMOS transistor are connected to the source area and the drain area of the PMOS channel and the source area and the drain area of the NMOS channel respectively through corresponding first via holes;

forming a flat layer on sources and drains of the PMOS transistor and the NMOS transistor and an exposed medium layer;

forming a common electrode layer on the flat layer;

forming a passivation layer on the common electrode layer and forming a second via hole in communication with the drain of the NMOS transistor through etching; and forming a transparent conductive layer on the passivation layer, wherein the transparent conductive layer is connected to the drain of the NMOS transistor through the second via hole.

According to one embodiment of the present disclosure, the NMOS transistor corresponds to an active area of the array substrate and the PMOS transistor corresponds to a non-active area of the array substrate.

According to another aspect, the present disclosure provides a low temperature polysilicon array substrate which is manufactured through the above method.

The following beneficial effects can be brought about by the present disclosure.

According to the present disclosure, on the basis of no mask is added, the hot carrier effect of the PMOS transistor can be alleviated.

Other advantages, objectives, and features of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art, and constitute one part of the description. The drawings are used for interpreting the present disclosure together with the embodiments, not for limiting the present disclosure. In the drawings.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Figure 1:
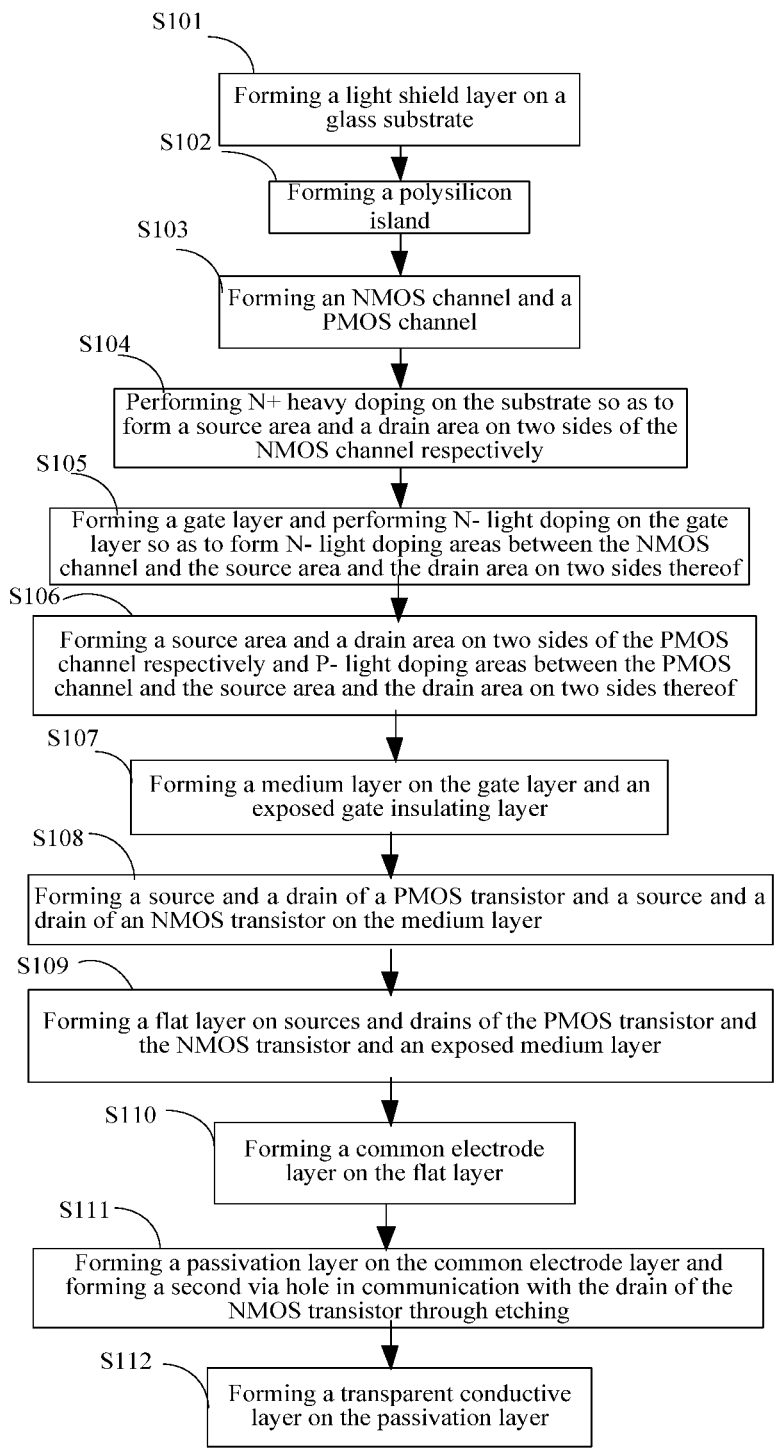
FIG. 1 is a flow chart of a method according to an embodiment of the present disclosure.

FIG. 1 is a flow chart of a method for manufacturing a low temperature polysilicon array substrate according to an embodiment of the present disclosure. The present disclosure will be illustrated in detail hereinafter with reference to FIG. 1.

In step S101, a light shield layer is formed on a glass substrate. Specifically, a metal material layer is deposited on the glass substrate, and the metal material is to etched to form the light shield layer. A corresponding light shield pattern of the light shield layer is in an active area of the array substrate.

In step S102, a buffer layer is formed on the light shield layer, a monocrystalline silicon material is deposited on the buffer layer, and the monocrystalline silicon material is treated to form a polysilicon island. Specifically, first, a buffer material (for example SiOx) layer is deposited on the light shield layer so as to form the buffer layer. The buffer layer covers the whole substrate in order to prevent device defect resulted from glass substrate defect. Then a monocrystalline silicon material layer is deposited on the buffer layer so as to form a monocrystalline silicon layer. At lastly, a crystallization treatment is performed on the monocrystalline silicon layer to form the polysilicon island. The polysilicon island is distributed on the buffer layer in an array.

In step S103, a channel of an NMOS area of the polysilicon island is doped, and P− light doping is performed on two areas at two sides of a PMOS area of the polysilicon island simultaneously with a first mask so as to form an NMOS channel and a PMOS channel respectively. Specifically, in this step, boron ions are implanted into two areas at two sides of the NMOS area and the two areas at the two sides of the PMOS area of the polysilicon island simultaneously with the first mask to perform P− light doping, so as to realize NMOS channel doping of the NMOS area and P− light doping of the two areas at the two sides of the PMOS area, and to form the NMOS channel and the PMOS channel respectively. The PMOS channel is covered by the first mask, while a whole NMOS area and the two areas at the two sides of the PMOS area are exposed. One part of the PMOS area which is not performed by P− light doping forms the PMOS channel. The whole NOMS area is performed by P− light doping, and the whole area thereof can serve as the NMOS channel. A width of the NOMS channel can be set specifically according to actual requirements.

Figure 2:
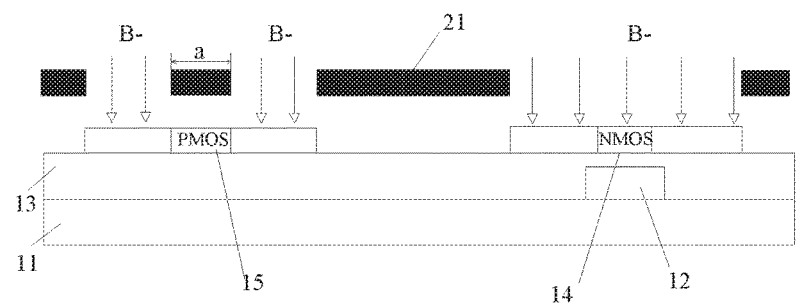
FIG. 2 schematically shows a step of performing channel doping and P− light doping simultaneously according to an embodiment of the present disclosure.

A structure of the substrate corresponding to this step is shown in FIG. 2. A light shield layer 12 is formed on a glass substrate 11, and a light shield pattern of the light shield layer 12 is arranged in the active area. A buffer layer 13 is formed on the light shield layer 12, and the buffer layer 13 covers the whole substrate. A polysilicon island is formed on the buffer layer 13. The polysilicon island comprises a PMOS area and an NMOS area. The PMOS area is used to form a PMOS channel 15 and corresponding source area and drain area. The NMOS area is used to form an NMOS channel 14 and corresponding source area and drain area. An ion implantation area of a first mask 21 comprises the whole NMOS area and the two areas at the two sides of the PMOS area, while the PMOS channel 15 is shielded. A width of an area on the first mask 21 for covering the PMOS channel is a, which is a width of the PMOS channel. Since the whole NMOS area is performed by P− light doping, the width of the NMOS channel 14 can be determined according to actual requirements.

In step S104, N+ heavy doping is performed on the substrate after the substrate is treated by the first mask so as to form a source area and a drain area on two sides of the NMOS channel 14 respectively. Specifically, N+ heavy doping is performed on a part of the NMOS area except the NMOS channel with the third mask so as to form the source area and the drain area on the two sides of the NMOS channel 14 respectively.

In step S105, a gate insulating layer is formed on the substrate after the substrate is treated by the N+ heavy doping, then a gate layer is formed on the gate insulating layer and N− light doping is performed on the gate layer so as to form N− light doping areas between the NMOS channel and the source area and the drain area on two sides thereof. Specifically, an insulating material layer is deposited on the substrate after the substrate is treated by the N+ heavy doping to form the gate insulating layer; a metal material layer is deposited on the gate insulating layer and the metal material layer is treated to form the gate layer; and N− light doping is performed on the NMOS channel with a fourth mask to form the N− light doping areas between the NMOS channel and the source area and the drain area on two sides thereof.

In step S106, the N− light doping areas are treated with a second mask, P+ heavy doping is performed on the substrate, a source area and a drain area are formed on two sides of the PMOS channel 15 respectively, and P− light doping areas are formed between the PMOS channel and the source area and the drain area on two sides thereof. Specifically, P+ heavy doping is performed on a part of the PMOS area except the PMOS channel with the second mask. A width of an area on the second mask for covering the PMOS channel is larger than a width of an area on the first mask for covering the PMOS channel such that the source area and the drain area are formed in one part of the PMOS area which is treated by both P+ heavy doping and P− light doping and P− light doping areas are formed in another part of the PMOS area which is merely treated by P− light doping. In this manner, through changing a width of a light shielding part of a mask above the PMOS channel, on the basis of no mask is added, a hot carrier effect of the PMOS transistor can be alleviated.

Figure 3:
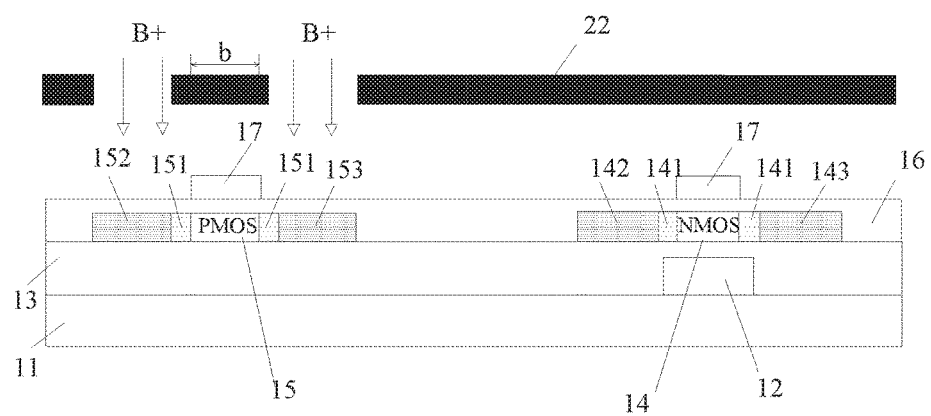
FIG. 3 schematically shows a step of performing P heavy doping according to an embodiment of the present disclosure.

A structure of the substrate corresponding to this step is shown in FIG. 3. A width b of an area on the second mask 22 for covering the PMOS channel is larger than the width a of a corresponding area of the first mask. Only one P− light doping treatment is performed on a corresponding area where the width b is larger than the width a, and two P− light doping areas 151 are formed. The outer sides of the two P− light doping areas 151 are connected to a source area 152 and a drain area 153. In step S105, two N− light doping areas 141 are formed on the two sides of the NMOS channel. The outer sides of the two N− light doping areas 141 are connected to a source area 142 and a drain area 143. A gate insulating layer 16 is formed on the NOMOS area and the PMOS area. A gate layer 17 is formed on the gate insulating layer 16. The gate layer comprises a gate corresponding to the NMOS channel and a gate corresponding to the PMOS channel.

In step S107, a medium layer is formed on the gate layer and an exposed gate insulating layer, and the medium layer is etched to form four via holes in communication with the source area and the drain area of the NMOS channel and the source area and the drain area of the PMOS channel respectively.

In step S108, a source and a drain of a PMOS transistor and a source and a drain of an NMOS transistor are formed on the medium layer wherein the source and the drain of the PMOS transistor and the source and the drain of the NMOS transistor are connected to the source area and the drain area of the PMOS channel and the source area and the drain area of the NMOS channel respectively through corresponding first via holes.

In step S109, a flat layer is formed on sources and drains of the PMOS transistor and the NMOS transistor and an exposed medium layer. Specifically, a flat insulating material layer is deposited on the sources and the drains of the PMOS transistor and the NMOS transistor and the exposed medium layer to form the flat layer.

In step S110, a common electrode layer is formed on the flat layer. Specifically, a conductive material is deposited on the flat layer, and the conductive material is treated to form a common electrode pattern.

In step S111, a passivation layer is formed on the common electrode layer, and a second via hole in communication with the drain of the NMOS transistor is formed through etching. Specifically, a passivation material is deposited on the common electrode layer to form the passivation layer, and the passivation layer is etched to form the second via hole in communication with the drain of the NMOS transistor.

In step S112, a transparent conductive layer is formed on the passivation layer, wherein the transparent conductive layer is connected to the drain of the NMOS transistor through the second via hole. Specifically, an indium tin oxide material layer is deposited on the passivation layer, and the indium tin oxide material layer is treated to form a pixel electrode layer. The pixel electrode layer is connected to the drain of the NMOS transistor through the second via hole.

According to the other aspect, the present disclosure further provides a low temperature polysilicon array substrate which is manufactured through the above method. The array substrate is manufactured through 12 steps as those in the prior art. Moreover, on the basis of no mask is added, P− light doping areas at the two sides of the PMOS channel can be formed, whereby the hot carrier effect of the PMOS transistor can be alleviated.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A method for manufacturing a low temperature polysilicon array substrate, comprising steps of:
   forming a light shield layer on a glass substrate;
   forming a buffer layer on the light shield layer, depositing a monocrystalline silicon material on the buffer layer, and treating the monocrystalline silicon material to form a polysilicon island;
   doping a channel of an NMOS area of the polysilicon island and performing P− light doping on two areas at two sides of a PMOS area of the polysilicon island simultaneously with a first mask so as to form an NMOS channel and a PMOS channel respectively;
   performing N+ heavy doping on the substrate after the substrate is treated by the first mask so as to form a source area and a drain area on two sides of the NMOS channel respectively;
   forming a gate insulating layer on the substrate after the substrate is treated by the N+ heavy doping, then forming a gate layer on the gate insulating layer and performing N− light doping on the gate layer so as to form N− light doping areas between the NMOS channel and the source area and the drain area on two sides thereof; and
   treating the N− light doping areas with a second mask, performing P+ heavy doping on the substrate, and forming a source area and a drain area on two sides of the PMOS channel respectively and P− light doping areas between the PMOS channel and the source area and the drain area on two sides thereof,
   wherein the step of doping a channel of an NMOS area of the polysilicon island and performing P− light doping on two areas at two sides of a PMOS area of the polysilicon island simultaneously with a first mask so as to form an NMOS channel and a PMOS channel respectively comprises specifically a step of:
   implanting boron ions into two areas at two sides of the NMOS area and the two areas at the two sides of the PMOS area of the polysilicon island simultaneously with the first mask to perform P− light doping, so as to realize NMOS channel doping of the NMOS area and P− light doping of the two areas at the two sides of the PMOS area, and to form the NMOS channel and the PMOS channel respectively,
   wherein the PMOS channel is covered by the first mask, while a whole NMOS area and the two areas at the two sides of the PMOS area are exposed,
   wherein the step of forming a source area and a drain area on two sides of the PMOS channel respectively and P− light doping areas between the PMOS channel and the source area and the drain area on two sides thereof specifically comprises a step of:
   performing P+ heavy doping on a part of the PMOS area except the PMOS channel with the second mask,
   wherein a width of an area on the second mask for covering the PMOS channel is larger than a width of an area on the first mask for covering the PMOS channel such that the source area and the drain area are formed in one part of the PMOS area which is treated by both P+ heavy doping and P− light doping and P− light doping areas are formed in another part of the PMOS area which is merely treated by P− light doping.

2. The method according to claim 1, wherein the step of forming a light shield layer on a glass substrate specifically comprises depositing a metal material layer on the glass substrate and treating the metal material layer to form the light shield layer.

3. The method according to claim 1, wherein the step of forming a buffer layer on the light shield layer, depositing a monocrystalline silicon material on the buffer layer, and treating the monocrystalline silicon material to form a polysilicon island specifically comprises sub steps of:
   depositing a buffer material layer on the light shield layer to form the buffer layer;
   depositing a monocrystalline silicon material layer on the buffer layer to form a monocrystalline silicon layer; and
   performing a crystallization treatment on the monocrystalline silicon layer to form the polysilicon island.

4. A low temperature polysilicon array substrate, wherein the low temperature polysilicon array substrate is manufactured through a following method; and
   wherein the method comprises steps of:
   forming a light shield layer on a glass substrate;
   forming a buffer layer on the light shield layer, depositing a monocrystalline silicon material on the buffer layer, and treating the monocrystalline silicon material to form a polysilicon island;
   doping a channel of an NMOS area of the polysilicon island and performing P− light doping on two areas at two sides of a PMOS area of the polysilicon island simultaneously with a first mask so as to form an NMOS channel and a PMOS channel respectively;
   performing N+ heavy doping on the substrate after the substrate is treated by the first mask so as to form a source area and a drain area on two sides of the NMOS channel respectively;
   forming a gate insulating layer on the substrate after the substrate is treated by the N+ heavy doping, then forming a gate layer on the gate insulating layer and performing N− light doping on the gate layer so as to form N− light doping areas between the NMOS channel and the source area and the drain area on two sides thereof; and
   treating the N− light doping areas with a second mask, performing P+ heavy doping on the substrate, and forming a source area and a drain area on two sides of the PMOS channel respectively and P− light doping areas between the PMOS channel and the source area and the drain area on two sides thereof, wherein the step of doping a channel of an NMOS area of the polysilicon island and performing P− light doping on two areas at two sides of a PMOS area of the polysilicon island simultaneously with a first mask so as to form an NMOS channel and a PMOS channel respectively specifically comprises a step of:

implanting boron ions into two areas at two sides of the NMOS area and the two areas at the two sides of the PMOS area of the polysilicon island simultaneously with the first mask to perform P− light doping, so as to realize NMOS channel doping of the NMOS area and P− light doping of the two areas at the two sides of the PMOS area, and to form the NMOS channel and the PMOS channel respectively, wherein the PMOS channel is covered by the first mask, while a whole NMOS area and the two areas at the two sides of the PMOS area are exposed, wherein the step of forming a source area and a drain area on two sides of the PMOS channel respectively and P− light doping areas between the PMOS channel and the source area and the drain area on two sides thereof specifically comprises a step of:

performing P+ heavy doping on a part of the PMOS area except the PMOS channel with the second mask, wherein a width of an area on the second mask for covering the PMOS channel is larger than a width of an area on the first mask for covering the PMOS channel such that the source area and the drain area are formed in one part of the PMOS area which is treated by both P+ heavy doping and P− light doping and P− light doping areas are formed in another part of the PMOS area which is merely treated by P− light doping.

5. The substrate according to substrate 4, wherein the step of forming a light shield layer on a glass substrate specifically comprises depositing a metal material layer on the glass substrate and treating the metal material layer to form the light shield layer.

6. The substrate according to claim 4, wherein the step of forming a buffer layer on the light shield layer, depositing a monocrystalline silicon material on the buffer layer, and treating the monocrystalline silicon material to form a polysilicon island specifically comprises sub steps of:

depositing a buffer material layer on the light shield layer to form the buffer layer;

depositing a monocrystalline silicon material layer on the buffer layer to form a monocrystalline silicon layer; and performing a crystallization treatment on the monocrystalline silicon layer to form the polysilicon island.

* * * * *